May 15, 1962 R. C. HEYSER 3,035,233
SELF-BIASING TRANSISTOR AMPLIFIER
Filed July 28, 1958
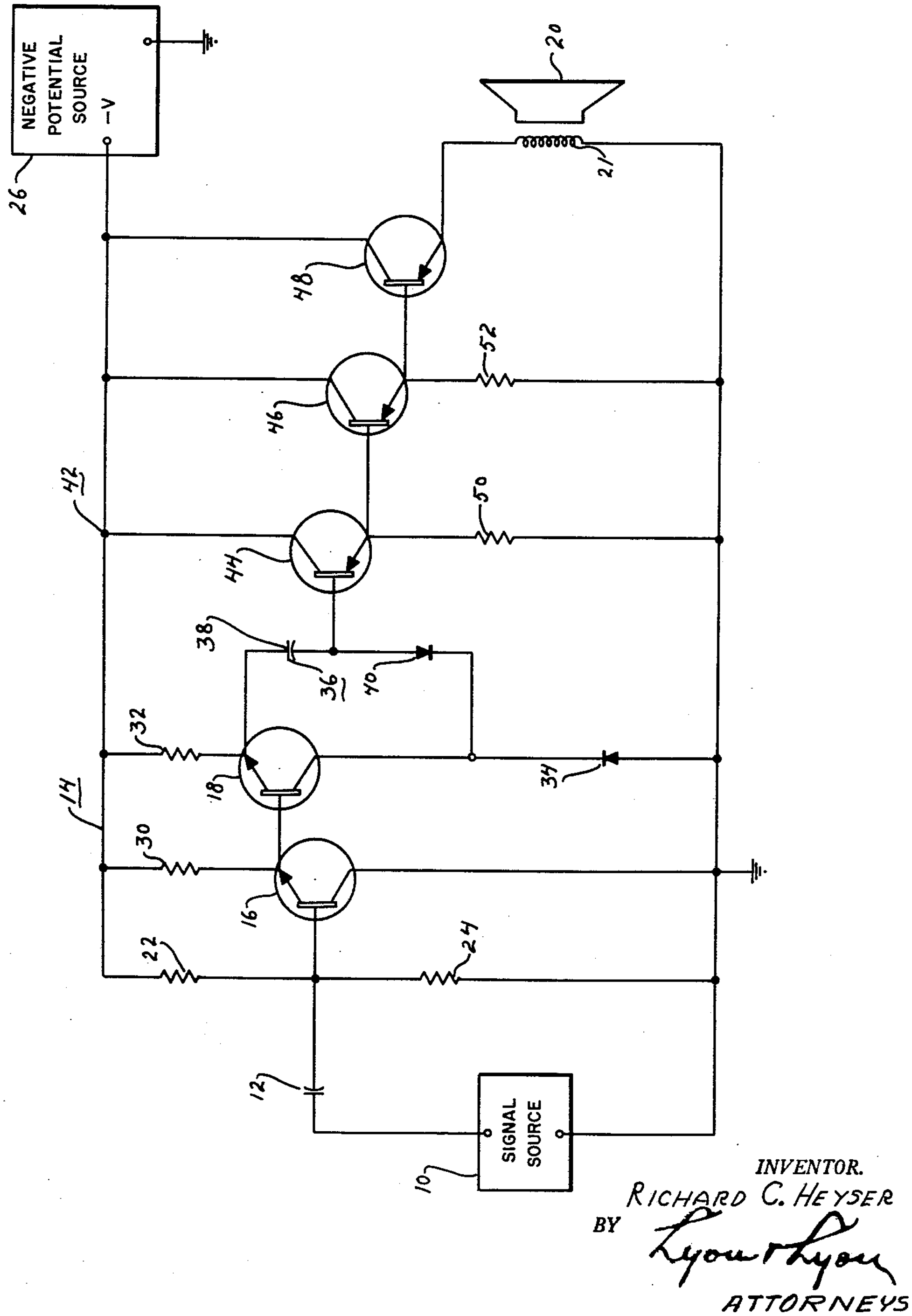
INVENTOR.
RICHARD C. HEYSER
BY Lyon & Lyon
ATTORNEYS

United States Patent Office 3,035,233

Patented May 15, 1962

3,035,233

SELF-BIASING TRANSISTOR AMPLIFIER

Richard C. Heyser, La Canada, Calif., assignor to California Institute Research Foundation, Pasadena, Calif., a corporation of California Filed July 28, 1958, Ser. No. 751,275

4 Claims. (Cl. 330—24)

This invention relates to transistor amplifiers and, more particularly, to improvements therein.

A major disadvantage of conventional class A operated amplifiers is the requirement that they continuously draw current from the power supply. As a result, the power supply drain is independent of any signal excitation. When transistor amplifiers are operated as class A, the maximum obtainable collector efficiency is 50 percent. The efficiency at maximum signal of the amplifier is not of too great consequence, when compared to the abnormal amount of supply power required to sustain signals lower than the peak signal to be carried.

An object of this invention is to provide a transistor amplifier which provides class A operation without using abnormal amounts of supply power.

Another object of this invention is to provide a novel transistor amplifying arrangement wherein the power supply drain is determined by the amplitude of the signal which is encountered.

Yet another object of the present invention is to provide a novel biasing arrangement for a transistor amplifier which enables more efficient operation than heretofore attainable.

These and other objects of the invention are achieved by an arrangement wherein signals for driving a load are applied to a biasing arrangement for a load driver amplifier. The biasing arrangement is connected to the driver amplifier in a manner to bias it so that the current requirements of the driver amplifier are always sufficient for the signal being amplified, and no more. The biasing arrangement includes a peak-clamping circuit which clamps the base of the first transistor in the driver amplifier at a potential such that the most positive-going signal does not drive this base to a potential which exceeds a predetermined bias.

The novel features that are considered characteristic of this invention are set forth with particularity in the appended claims. The invention itself, both as to its organization and method of operation, as well as additional objects and advantages thereof, will best be understood from the following description when read in connection with the accompanying drawing, which is a circuit diagram of an embodiment of the invention.

Referring now to the circuit diagram of the invention shown in the drawing, a signal source 10 provides signals through a coupling capacitor 12 to a preamplifier 14, which includes a first and second transistor, respectively 16, 18. The signals provided by the source may be audio-frequency signals, by way of example, which it is desired to amplify and apply to a load 20 consisting of a loudspeaker. A bias level is established for the preamplifier by means of two resistors 22, 24, which are connected in series across a negative-potential source 26. The two transistors 16, 18 are connected in an emitter-follower arrangement. The base of transistor 16 is connected to the junction of the two resistors 22, 24 and also to receive the signals from the source 10. The emitter of transistor 16 is connected to the potential source 26 through a resistor 30. The collector of the transistor 16 is connected to ground or to the other side of the negative potential source 26. Transistor 18 has its base connected to the emitter of transistor 16 to derive signals therefrom. The emitter of transistor 18 is connected to the negaive-potential source through a load resistor 32.

The collector of transistor 18 is connected to the ground, or opposite side, of the negative-potential source through a diode 34. This diode is connected between ground and the collector in a forward, or conductive, direction.

The emitter of transistor 18 is connected to the peak clamping circuit or biasing circuit 36. This includes a capacitor 38, which has one side connected to the emitter of transistor 18 and the other side connected to a diode 40. Diode 40 will hereafter be referred to as the first diode, and diode 34 will hereafter be referred to as the second diode. The peak clamping circuit includes the capacitor 38 and the first and second diodes, respectively, 40, 34.

It will be noted that the first diode is connected to the second diode in a reverse conduction direction. In other words, diode 34 conducts current to the collector of transistor 18 while such current cannot flow through diode 40. Diode 40, however, is biased by the voltage drop established across diode 34 by reason of the current conduction therethrough. Any signals which are applied to capacitor 38 cannot pass through diode 40 unless they exceed the value of the bias applied to the cathode of diode 40 by diode 34. It is preferred that a silicon diode be employed for diode 34 which develops a biasing potential with current flow therethrough on the order of 0.6 volt.

The biasing circuit is connected to a load driver or power amplifier 42, which includes three transistors 44, 46, and 48. These three transistors are connected in emitter-follower fashion. The collector of each of these transistors is connected to the negative potential source. The emitter of transisor 44 is connected through a load resistor 50 to the ground side of the negative-potential source. The emitter of transistor 46 is connected through a resistor 52 to the ground side of the negative-potential source, and the load 20, including the voice coil of the loudspeaker 21, as well as the loudspeaker itself, is connected to the emitter of transistor 48.

The base of transistor 44 is connected to the junction between capacitor 38 and the first diode 40. Any bias which is applied to the base of transistor 44 is also applied to transistors 46 and 48 by reason of the fact that the potential drops between the bases and emitters of these emitter-follower-connected transistors is substantially minimal and may be disregarded. It will be appreciated, therefore, that any bias which is applied to the base of transistor 44 to enable it to conduct current is also applied to the transistors 46 and 48, so that their current conductive status is likewise determined. Capacitor 38 charges up to the peak value of any signal applied thereto through the circuit, including the capacitor and the paths between the bases and emitters of transistors 44, 46, 48 and the voice coil 21. No signal will pass through diode 40 unless the amplitude of that signal exceeds the bias level set by diode 34 as a result of the collector current of transistor 18 passing therethrough. The current drain of the power amplifier on the power supply, therefore, is always determined by the level of the signal which is applied to the biasing circuit which biases the power amplifier. Effectively, therefore, what is obtained is a class A amplifier. The efficiency of the amplifier is accordingly increased.

When new signal-level peaks are received by the biasing circuit, a certain time interval may be required for charging the capacitor 38. This is determined by the impedance of the charging path. In an embodiment of the invention which was built, using a low-impedance load, such as a two- or eight-ohm loudspeaker coil, the charging intervals were not detectable. The inductance of the loudspeaker causes an operation here which is not different than that normally experienced when suddenly a signal is applied to a loudspeaker. Effectively, therefore, it may be said that the load inductance maintains the operation of the amplifier linear in those regions where, due to sudden signal-amplitude changes, the capacitor charge or discharge circuit would not be expected to follow such signal changes as rapidly as is desired. As pointed out above, in an embodiment of the invention which was built, these regions were completely undetectable to the ear.

Capacitor 38 can discharge through the effective resistance presented by transistor 44 and diode 40 in parallel. The low-frequency response is a function of this discharge time and can be adjusted by selecting the values of capacitor 48 and diode 40 and transistor 44 to have a desired effective resistance. The load may be connected to the collector of transistor 48 instead of the emitter, but thereby the current-sustaining properties of an inductive voice coil would be lost.

The arrangement shown in the circuit may be employed to drive a push-pull load, rather than a single-ended load as shown, by employing two of the circuits shown in the drawing wherein the outputs consisting of the emitter of each of the transistors 48 are connected to either end of the push-pull load and push-pull signals are applied to the two inputs. While in the arrangement shown in the drawing the preamplifier transistors are represented as the NPN type and the driver-amplifier transistors are represented as the PNP type, this is not to be construed as a limitation upon the invention, since those having the skill of a technician in the art can readily interchange the transistor types and reverse the polarities of the first and second diodes to provide the required operation where the types of transistors are interchanged, without departing from the spirit and scope of this invention.

Accordingly, there has been shown and described hereinabove a novel, useful, signal-biased transistor amplifier wherein the power drain on the power supply is determined by the signal amplitude which is applied to a biasing circuit for the power amplifier, thereby providing a more efficient arrangement with class A type of operation than heretofore obtainable.

What is claimed is:

1. A clamping network connected between two cascaded amplifier stages wherein signals to be amplified are applied to a preceding one of said two cascaded amplifier stages, said clamping network including a capacitor having one side connected to the output of the preceding one of said two cascaded amplifier stages to receive output signals therefrom, a clamping diode having one electrode connected to the other side of said capacitor, semiconductor diode means connected to the preceding one of said two cascaded amplifier stages with a polarity not to impede current flow therethrough due to signals whereby a voltage is established thereacross due to said current flow, means for connecting said semiconductor diode means to said clamping diode to apply the voltage thereacross to said clamping diode as a reverse bias, said following one of said two cascaded amplifier stages including a transistor having a base and an emitter, means connecting said base to said other side of said capacitor, a load, and a discharge path for said capacitor including said load connected to said emitter.

2. A signal-biased transistor amplifier as recited in claim 1 wherein said preceding one of said two cascaded amplifier stages includes a transistor having an emitter and collector element, means for connecting said emitter to said one side of said capacitor, and means connecting said collector element to said other electrode of said clamping diode.

3. A signal-biased transistor amplifier including a preamplifier transistor having emitter and collector elements, a power output transistor having a base and emitter elements, a capacitor connected between said preamplifier transistor emitter and said power output transistor base, a first diode, a second semiconductor diode, means connecting said second diode in a current conductive direction in series with said preamplifier transistor collector, means connecting said first diode in a reverse conductive direction relative to said second diode between said preamplifier transistor collector and said power output transistor base.

4. A signal-biased transistor amplifier including a preamplifier transistor and load driver transistor each of said transistors having emitter, base and collector elements, means for applying input signals to said preamplifier transistor base, a load resistor connected to said preamplifier transistor emitter, a capacitor connected between said preamplifier transistor emitter and said load driver transistor base, a first and second diode, means connecting said second diode in series with said preamplifier transistor collector and in a current conductive direction relative thereto, a source of operating potential, means for connecting said source of operating potential to said load resistor and said second diode, means connecting said first diode in a nonconductive direction relative to said second diode between said preamplifier transistor collector and said load driver transistor base, a load connected to said load driver transistor emitter, and means for connecting said source of operating potential to said load and to said load driver transistor collector.

References Cited in the file of this patent

UNITED STATES PATENTS

| | | |
|---|---|---|
| 2,550,715 | Norton | May 1, 1951 |
| 2,760,008 | Schade | Aug. 21, 1956 |
| 2,860,196 | Schultz | Nov. 11, 1958 |
| 2,887,542 | Blair | May 19, 1959 |
| 2,943,266 | Belland | June 28, 1960 |

FOREIGN PATENTS

| | | |
|---|---|---|
| 1,141,816 | France | Mar. 18, 1957 |